United States Patent

Graf

[15] 3,644,838

[45] Feb. 22, 1972

[54] AMPLIFIER USING BIPOLAR AND FIELD-EFFECT TRANSISTORS

[72] Inventor: Stefano Graf, New York, N.Y.

[73] Assignee: RCA Corporation

[22] Filed: June 11, 1970

[21] Appl. No.: 45,509

[52] U.S. Cl. ..................................330/3, 330/35, 330/30 D, 330/24, 330/26

[51] Int. Cl. ..........................................H02f 5/00, H03f 3/16

[58] Field of Search......................330/30 D, 69, 35; 307/263, 307/230

[56] References Cited

UNITED STATES PATENTS 3,451,001 6/1969 Foerster...................................330/17

*Primary Examiner*—Nathan Kaufman
*Attorney*—H. Christoffersen

[57] ABSTRACT

A high-speed, high slew rate operational amplifier comprised of bipolar and insulated-gate field-effect transistors (IGFET's). The amplifier includes a bipolar differential input stage whose active load is the source-drain path of a first IGFET. The source-drain path of a second IGFET is connected between the output node of the differential input stage and the input of the emitter follower output stage. The second IGFET operated in the common-gate configuration level shifts the DC level and translates the signal current from the input stage to the output stage providing voltage gain.

12 Claims, 2 Drawing Figures

INVENTOR.
Stefano Graf
BY H. Christoffersen
ATTORNEY

INVENTOR.
Stefano Graf
BY H. Christoffersen
ATTORNEY

AMPLIFIER USING BIPOLAR AND FIELD-EFFECT TRANSISTORS

BACKGROUND OF THE INVENTION

The slew rate (S) of an amplifier defines the maximum rate of change of the amplifier's output voltage for a large step input signal change and is thus a measure of the large signal frequency response of the amplifier. The slew rate is related to the small signal bandwidth, but whereas the latter is a measure of the small-signal frequency response of the amplifier, the former is much more limited by the capacitance at any node and/or the saturation (voltage or current) of any stage. Thus whereas an amplifier may have a bandwidth of the order of 1 to 2 MHz, its slew rate may be of the order of 1 to 2 volts per microsecond ($v./\mu$sec.).

There thus exists a very serious problem when amplifiers, especially of the monolithic variety with slew rates of more than 50 volts per microsecond, are desired. Some of the problems limiting slew rate and resolved by the invention are discussed below.

In order to develop the necessary gain, some presently commercially available amplifiers have two or more gain stages and attendant thereto two or more low-frequency poles. These amplifiers are normally operated in a closed-loop configuration and often at unity gain which is the worst case condition for stability consideration. To ensure the stability of a multipole operational amplifier under closed-loop and unity gain conditions, some type of frequency compensation is usually necessary. The compensation networks normally require the addition of capacitors to the circuit which limits the natural bandwidth and slew rate of the amplifier.

An additional major problem present in the design of conventional high speed monolithic amplifiers is the level shifting network used to couple the differential input stage to the rest of the amplifier. The level shifting network normally uses either: (1) a lateral (usually PNP) bipolar transistor as shown in the prior art such as U.S. Pat. No. 3,451,001, entitled, DC AMPLIFIER, issued to R. P. Foerster, or (2) a resistor divider-type network.

The lateral bipolar transistor has a very limited frequency response. It has low gain and in order to carry the necessary current levels has to be made physically large. The increased size increases the junction capacitance and this introduces phase shift and a low-frequency pole in the amplifier. The magnitude of the problem is best illustrated by the fact that the forward current gain ($\beta$) of such devices is normally unity at about 5 MHz. Thus, the device may effectively be replaced by a wire short circuit) at the upper frequency range of interest.

When a resistor divider network as suggested in (2) above is employed, an emitter follower must be employed to prevent loading the differential input stage and it also introduces capacitance and phase shifting in the signal path.

Still another problem present in most known designs is the load used in the differential input stage. It it comprises lateral bipolar transistors, the above listed comments apply even more strongly since the effective decrease in the output impedance of these devices with frequency effectively shorts out the signal. If it is attempted to use resistors (as shown in the Foerster patent) additional problems arise. If their value is relatively low, of the order of kilohms, the power dissipation is increased and the resistors effectively shunt out a portion of the signal. If their value is relatively high,, the current passing to the first stage is decreased and this decreases its transconductance and the gain. In addition, the larger resistors (the additional length between terminals) require more of the relatively limited "chip" area and, in addition, add shunt capacitance at a very sensitive point.

Accordingly, it is an object of the invention to provide a new, simple, and improved amplifier having effectively a single low-frequency pole.

It is another object of this invention to provide an amplifier having a level shifting network whose associated capacitance is extremely low and whose frequency response is much greater than that available with lateral bipolar transistors.

It is still another object of this invention to provide operational amplifiers of high-speed and high slew rates.

SUMMARY OF THE INVENTION

An amplifier including a differential input stage having connected at its output node an active load. A field-effect transistor operated in the common gate configuration is connected between the output node and a voltage follower output stage. The field-effect transistor level shifts the DC level at the output node of the input stage and translates the signal current generated at the output node to the output stage.

BRIEF DESCRIPTION OF THE DRAWINGS

In the accompanying drawings, like reference characters denote like components, and, FIG. 1 is a schematic diagram of a single-ended differential amplifier embodying the invention.

DETAILED DESCRIPTION

Figure 1:
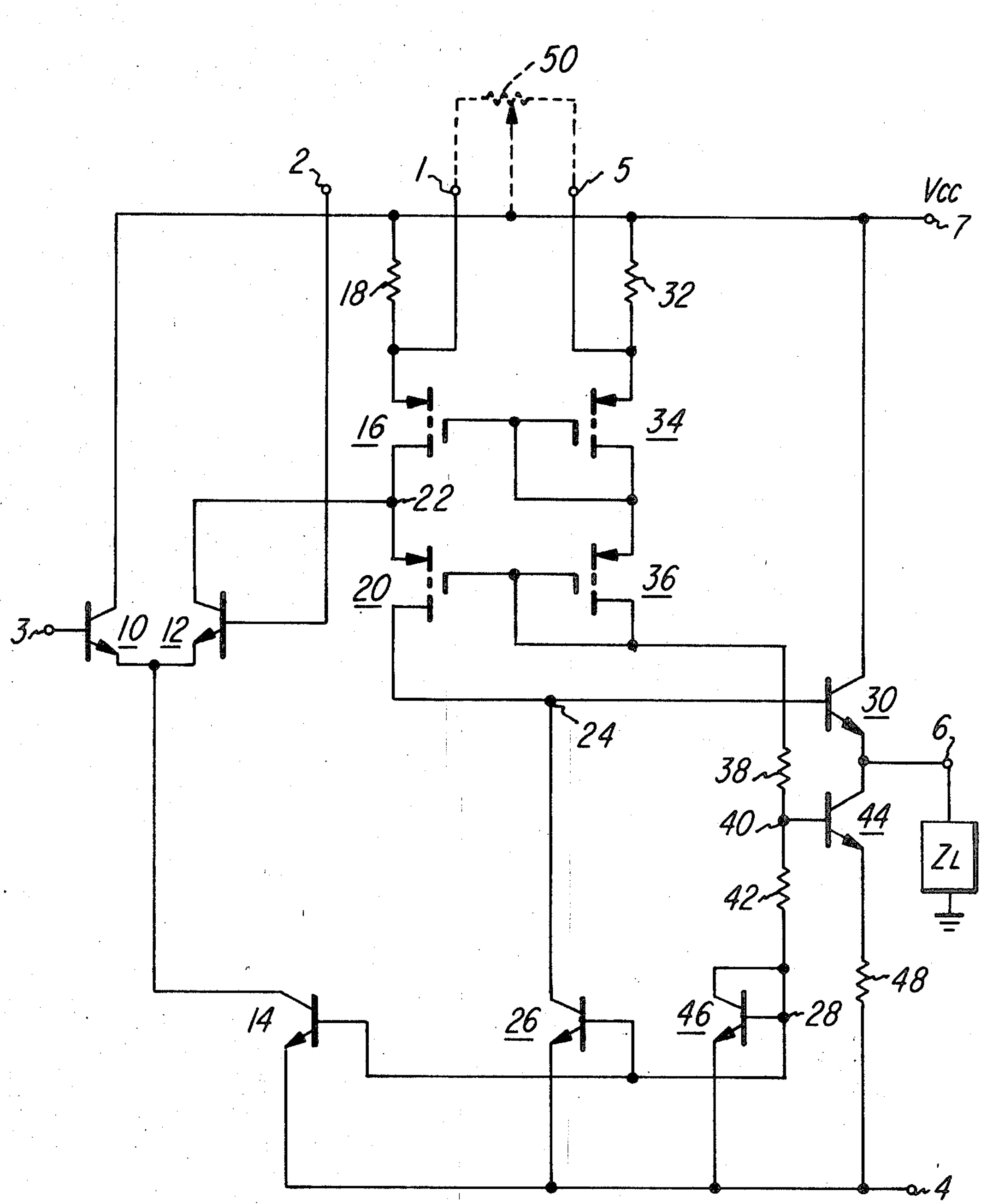

The invention is illustrated using junction (bipolar) transistors of one conductivity type and insulated-gate field-effect transistors (IGFET'S) of a second conductivity type. Specifically, the bipolar transistors are NPN's (selected because of their higher speeds) and are all of the vertical type. The IGFET's are P-channel metal-oxide semiconductor (MOS) transistors (selected because they are most compatible functionally and for fabrication with the NPN's). In addition, the insulated-gate field-effect transistors have been selected because of their excellent frequency characteristics and their low interelectrode capacitance. It should be understood that PNP bipolar transistors of the vertical type could also be used in combination with compatible types of field-effect transistors. A criteria of circuits embodying the invention being the use of bipolar transistors of the vertical type in combination with IGFET's and the elimination wherever possible of lateral bipolar transistors.

One of the main reasons for replacing lateral bipolar transistors with IGFET's is that, based on transit time consideration, an IGFET having similar physical dimensions to a bipolar transistor has an inherent frequency response nearly 40 times that of a corresponding bipolar transistor. Neglecting interelectrode capacitance, it may be assumed that the frequency response of the bipolar transistor is limited by base transit time ($Y_b$) and that the frequency response of the IGFET is limited by the source-to-drain transit time ($Y_c$). The expression for base transit time of a bipolar device is:

$$Y_b = W^2/nD \qquad (1)$$

where:

W = base width

D = diffusion coefficient for minority carriers in the base n = constant ($\approx 2.4$)

A similar expression for the channel transit time of a P-type IGFET is:

$$Y_c = L^2/\mu_p(V_G - V_T) \qquad (2)$$

where:

L = channel length $\mu_p$ = effective mobility of holes in the channel which is a constant (for N-type devices $\mu_n$ is the effective mobility of electrons in the channel)

$V_G$ = applied gate potential $V_T$ = threshold voltage and defines that value of gate-to-source potential below which no drain current flows. The ratio of $Y_c$ to $Y_b$ obtained from equations (1) and (2) is:

$$\frac{\tau_c}{\tau_b} = \frac{W^2}{nD} \times \frac{\mu_p(V_G - V_T)}{L^2} \qquad (3)$$

Note that $V_G - V_T$ is a constant and may be set approximately equal to $n$. Note also that the regions of the lateral bipolar transistor are fabricated in a similar manner to the source-drain regions of an IGFET and therefore the dimensions and tolerances for $W$ and $L$ may be assumed to be approximately equal. Therefore the ratio of $\Upsilon_c$ and $\Upsilon_b$ may be expressed as:

$$\Upsilon_c/\Upsilon_b=\mu_p/D \quad (4)$$

(To highlight the comparison, the P-type IGFET is compared to the PNP bipolar transistor.) The diffusion coefficient $D_p$ of a PNP bipolar may be expressed as:

$$D_p=\mu_p(KT/q) \quad (5)$$

Substituting equation (5) into equation (4) yields:

$$\Upsilon_c/\Upsilon_b=q/KT\approx 40 \quad (6)$$

Under these simplified assumptions, an IGFET having a channel length equal to the base width of a bipolar transistor is seen to have an inherent frequency capability approximately 40 times greater than the equivalent bipolar device.

An examination of equations (1) and (2) reveals the different operating mechanisms in bipolar and IGFET transistors. In the bipolar transistor there is diffusion of minority carriers across the base. In the FET transistor, majority carriers drift across the channel under the influence of an electric field. Thus in the case of the FET there is much greater momentum imparted to the moving charges and corresponding lower transit times.

The results of equation (5) have been obtained assuming the base width of the bipolar transistor to be equal to channel length. This assumption is valid for the comparison of the lateral-type transistor to the IGFET. However, it should also be appreciated that the base width (W) of typical vertical bipolar transistors is determined by the difference of two well-controlled vertical dimensions in the silicon bulk, while the channel length (L) is a surface dimension limited by the resolution of the present lithographic techniques.

Thus presently available vertical bipolar devices have a base width much smaller than the channel length of presently available IGFETs. However, where the channel length (L) may be controlled by diffusion techniques, it should be clear that extremely fast devices are obtained.

These principles have been carefully considered, and are reflected in the circuits embodying the invention.

The amplifier of FIG. 1 includes a differential input stage—NPN bipolar transistors 10 and 12, having their bases connected to input signal terminals 3 and 2 respectively. Terminal 2 is denoted as the inverting input terminal since signals applied thereto cause an out-of-phase signal to be produced at terminal 6. Input terminal 3 is denoted as the noninverting input terminal since signals applied thereto cause an in-phase signal to be produced at output terminal 6. Transistors 10 and 12 are both connected at their emitters to the collector of NPN bipolar transistor 14. The latter acts as a current source maintaining a relatively constant current flow to the common emitter connection of the differential input stage. The collector of transistor 10 is returned to power supply terminal 7 while the collector of transistor 12 is connected to junction point 22—the single-ended output point or node of the differential stage.

A positive potential of amplitude $V_{cc}$ (which is typically 10 volts) may be applied to terminal 7 and a negative potential of amplitude $V_{ee}$ (which is also typically 10 volts) may be applied to terminal 4. It is preferable, though not necessary, that $V_{cc}$ and $V_{ee}$ be equal in order to have balanced DC operation i.e., to provide zero volts midway between $V_{cc}$ and $V_{ee}$).

The active load of the differential input stage comprises IGFET transistor 16. Its drain is connected to junction point 22 and its source is connected through resistor 18 to terminal 7. Transistor 16, operated as a current source, is forward biased by means of transistor 34 to conduct a fixed amount of current for the circuits including transistor 12 and the level shifting network connected to node 22. An important characteristic of this current source is its extremely high output impedance which remains relatively constant for a broad frequency range starting at DC level and extending above 10 megahertz ($10_7$ Hz). In contrast thereto, if, as shown in prior art circuit U.S. Pat. No. 3,451,001, a resistor was used to provide the same dynamic impedance as the IGFET, its value would be inordinately high, it would have excessive shunt capacitance and, in monolithic form, would require so much area as to render the scheme impractical. Also, to establish the same bias current as is achieved with the IGFET an extremely high source of operating potential would be required which is impractical for integrated circuits. If a lateral transistor were used, it would have a relatively limited frequency response and would have to be made so large in order to carry the current levels necessary, that it would be effectively a short circuit at the upper portion of the frequency range of interest. Also, even within the useful frequency range of operation the output impedance of the lateral PNP is considerably lower than the output impedance of a corresponding IGFET.

The source-drain path of IGFET transistor 20 is connected between output point 22 and junction point 24. The base of transistor 30 and the collector of current source transistor 26 are also connected to junction point 24. The static or quiescent current flowing through transistor 20 flows substantially entirely into the "sink" transistor 26 which appears as an equivalent high impedance (1 to 2 megohms) connected to node 24. The gate of transistor 20 is connected in common to the gate and drain of transistor 36. The direct voltage at the gates of both transistors 20 and 36 is maintained (as shown below) at a relatively fixed level which is equal to the value of the potential at terminal 7 ($V_{cc}$) minus the sum of the voltage drop across resistor 32 plus the sum of the threshold voltage drops of transistors 34 and 36.

Transistor 20 is used to shift the level of the voltage present at the differential output node 22 to a different value at terminal 24 so that when the differential input signals are zero volts, the voltage at amplifier output terminal 6 is also zero volts. This important requirement of operational amplifiers makes it possible, if desired, to connect a feedback network (not shown) between the input terminals (2,3) and the output terminal 6 of the amplifier. Also, since transistor 20 is connected at its gate to a fixed direct voltage point, that is, the transistor is connected in the common-gate configuration, it transmits the signal current generated at output node 22 to junction point 24. An important aspect of this configuration is that the effective input impedance, looking into the source of transistor 20, is relatively low (1–10 Kohms) while its output impedance at junction point 24, that is, looking into the drain of transistor 20, is very high (greater than 5 megohms).

The emitter follower output stage includes NPN bipolar transistor 30 having its base connected to junction point 24, its emitter to output terminal 6 and its collector to terminal 7. At output terminal 6 the amplifier produces a single-ended output across a load $Z_L$ in response to signals applied at terminals 2 and 3. The remainder of the output stage includes NPN bipolar transistor 44 having its collector connected to terminal 6 and its emitter connected through resistor 48 to terminal 4. Transistor 44 is normally forward biased and acts as a current sink whose current level, under balanced input conditions, is equal to the emitter current of transistor 30 current flowing into terminal 6. When the emitter current through transistor 30 is equal to the collector current through transistor 44, no current flows through the load impedance $Z_L$ and the potential at terminal 6 is substantially equal to zero volts.

The biasing network determining the gate potential of transistors 16 and 20 and the static current levels in the amplifier is a circuit branch connected between terminals 7 and 4 and comprising resistor 32, IGFET transistors 34 and 36, resistors 38 and 42 and NPN bipolar transistor 46. The latter is connected as a diode, that is, its collector is shorted to its base. Resistor 32 is connected at one end to terminal 7 and at the other to the junction of terminal 5 and the source of transistor 34. The drain and gate of transistor 34 are connected in common to the gate of transistor 16 and to the source of transistor 36. The drain and gate of transistor 36 are connected in common to the gate of transistor 20 and to one end of resistor 38. The other end of resistor 38 is connected to junction point 40 to which is connected one end of resistor 42 and the base of transistor 44. The other end of resistor 42 is connected to junction point 28 to which is also connected the base and collector electrodes of transistor 46 and the bases of transistors 14 and 26. The emitters of transistors 14, 26 and 46 are connected in common to terminal 4.

Resistors 18 and 32, as well as terminals 1 and 5 between which a potentiometer 50 (shown in phantom view in FIG. 1) may be connected, are provided to enable the fine adjustment of the current levels in the various branches of the amplifiers. However, in the interest of simplifying the explanation to follow, it will be assumed that terminals 1 and 5 are connected to terminal 7 shorting out resistors 18 and 32.

Transistors 34 and 36 are connected to operate as "MOS" diodes. Each has its gate electrode connected to its drain electrode so that the potential ($V_{GS}$) developed between the source and gate electrode of each device is equal to its source-to-drain potential ($V_{DS}$) which in turn is equal to its threshold voltage ($V_{TH}$). Though $V_{TH}$ varies as a function of the source-to-drain current ( $I_{DS}$), it may be assumed to be constant in calculating to a first approximation the value of $I_{DS}$ (denoted as $I_B$ for ease of reference) flowing in the biasing network.

$$I_B=\frac{V_{cc}-(-V_{ee})-2\times V_{\mathrm{TH}}-V_{\mathrm{BE}}}{R_{\mathrm{TOTAL}}} \quad (7)$$

where:

a. $V_{cc}$ and $V_{ee}$ are the values of operating potential applied to terminals 7 and 4 respectively;

b. $2\times V_{TH}$ includes the threshold voltages of transistors 34 and 36 which are assumed to be the same;

c. $V_{BE}$ is the base-to-emitter voltage drop of transistor 36; and d. $R_{TOTAL}$ is the total resistance present in the series branch and is (with resistor 32 shorted) approximately equal to the sum of the resistance of resistors 38 and 42.

Since the gate of transistor 16 is common to the gate-drain of transistor 34 and since the source of transistor 16 is common to the source of transistor 34, the gate-to-source potential ($V_{GS}$) of transistor 16 is equal to the $V_{GS}$ of transistor 34.

The value of $V_{TH}$ for a given drain-source current is a function of the area of the device. By making the area of transistor 16 a given ratio of the area of transistor 34 the current in transistor 16 may be controlled and determined by the current in transistor 34. Thus, IGFET's which are voltage-amplifying devices, may be connected to generate currents in various of the other circuit branches. In the circuit of FIG. 1 the corresponding areas of transistors 16 and 34 are made equal so that the current through transistor 16 is made equal to the current $_B$ through transistor 34.

The remainder of the biasing network is comprised of resistors 38 and 42 and diode connected transistor 46. The biasing current $I_B$ provides the collector current for transistor 46 as well as the base current fro transistors 14, 26, 46 and 44. The emitter current flowing in transistors 14, 26 and 46 is a direct function of their base-to-emitter junction area. By controlling the junction areas of the respective devices it is possible to make the emitter currents of transistors 14 and 26 a known ratio of the collector current of transistor 46. Furthermore, these transistors may be made to have a relatively high forward current gain ($\beta$) to cause their collector currents to be at a known in advance fixed level related to the value of $I_B$.

It can also be shown that the quiescent emitter current $I_E$ of transistor 44 is substantially equal to the current $I_B$ through the series branch. The voltage drop across resistor 42 ($I_b\times R_{42}$ ) plus the base-to-emitter voltage drop ($V_{BE}$) of transistor 46 is equal to the base-to-emitter drop ($v_{BE}$) of transistor 44 plus the voltage drop across resistor 48 ($I_E\times R_{48}$). In mathematical terms, $I_BR_{42}+v_{BE}=I_ER_{48}+V_{BE}$. As $V_{BE}$ of transistor 46 is substantially equal to the $V_{BE}$ of transistor 44, it follows that the product of $I_B\times R_{42}$ is equal to the product of $I_E\times R_{48}$. Whereas in the circuit of FIG. 1 resistor 48 is made substantially equal to resistor 42 it follows that the two currents are substantially equal ($I_B\cong I_E$).

Assume now that transistors 14 and 46 have substantially equal areas and transistor 26 has one-half the area so that the collector current of transistor 26 is made substantially equal to $I_B/2$ while the collector current of transistor 14 is made substantially equal to $I_B$. In addition, given the present status of semiconductor technology, the differential pair transistors 10 and 12 may readily be manufactured with matching characteristics so that under balanced conditions (i.e., the same signal is applied to the inverting and noninverting terminals) substantially the same current $I_B/2$ flows through each transistor.

Junction point 22 acts as a current summing node. Transistor 16 provides a current of $I_B$ into the node, while transistor 12 draws or sinks a current equal to $I_B/2$ and the remaining current $I_B/2$ flows through the source-drain path of transistor 20 and into current sink transistor 26.

Transistor 20 has its gate connected in common to the gate-drain of transistor 36. The potential at the gate-drain of transistor 36 (with resistor 32 shorted) will be two threshold voltage drops below the potential at terminal 7. This assures that the gate-to-source potential of transistor 20 is at last equal to its $V_{TH}$ thus biasing transistor 20 into conduction. Thus, the biasing network by using two IGFET's, a diode connected transistor and associated impedances establishes the quiescent current levels throughout the amplifier. In addition, it ensures balance between the current sources and the current sinks for the condition of zero differential input. Also, the biasing network provides two DC potential levels for respectively biasing the active load 16 and the level translating stage 20 into conduction.

The operation of the amplifier may be viewed as follows. Assume for tutorial purposes that a differential signal ($\Delta V_B$) is applied between terminals 3 and 2 and that the potential at terminal 3 is positive with respect to the potential applied at terminal 2. Under this condition, the current through the collector-to-emitter path of transistor 10, which acts as an emitter follower, is increased while there is a decrease of a like amount in the current through transistor 12. The change in current ($\Delta I_C$) in transistor 12 is equal to the effective transconductance ($gm_1$) of the differential input stage multiplied by the differential input signal ($\Delta V_B$); [$\Delta I_C$=gm $_1\times\Delta V_B$]. Since transistor 16 provides a relatively constant current, there is a net increase of $\Delta I_C$ in the current flowing into transistor 20.

Transistors 16 and 12 may therefore be replaced by an equivalent current generator having a signal amplitude of $\Delta I_C$ which is applied at junction point 22 to the source of transistor 20. The current generator drives the following three impedances which are effectively in parallel across it: (1) the output impedance of transistor 12; (2) the output impedance of transistor 16; and (3) the input impedance of the common gate transistor 20. Since the input impedance to the common gate transistor is extremely low relative to the high output impedance of transistors 12 and 16, virtually all of the signal current ($\Delta I_C$) flows into it and little, if any, of the signal current will be shunted by transistors 12 and 16. It should also be pointed out that since the input impedance of the common gate transistor 20 is relatively low, no large voltage swings are developed at junction point 22. Also, any capacitance—no matter how larege—is shunted by the low impedance of the transistor. These factors minimize the effect of the already low capacitance present at junction point 22, and eliminate that point as a possible low frequency pole.

The current applied at junction 22 to the source of transistor 20 flows through its source-drain path to junction point 24. Due to the insulator between the gate and source there is no loss of DC bias current, and, due to the extremely low interelectrode capacitance of the device, the signal current will continue to flow from source to drain over a wide frequency range. It should be noted that for a typical IGFET the signal current at 20 MHz is 3 db. down (0.707) from its low frequency (DC) value.

In contrast thereto, current flowing through a typical lateral bipolar transistor is 3 db. down from its low frequency (DC)

value for signal frequencies in the range of 1 megahertz ($10^6$ Hz). Thus, over a broad frequency range (1 to 20 MHz) the IGFET transmits the signal current applied to its source while the lateral bipolar transistor shunts more and more of the signal current into its base circuit thereby drawing away some or all of the signal current from the load.

The equivalent circuit looking into the drain of transistor 20 is that of a current generator, having a signal amplitude substantially still equal to $\Delta I_C$, which is applied at junction point 24. This current generator is now shunted by the following three impedances which are also effectively in parallel: (1) the output impedance of transistor 20; (2) the output impedance of transistor 26; and (3) the load impedance $Z_L$ multiplied by the $\beta$ of transistor 30. The output impedance of transistor 20 is extremely high (above 5 megohms) and has little effect on the signal developed at junction point 24. The output impedance of transistor 26 is in the order of 1 megohm or more. The reflected load impedance at junction point 24 is the load impedance multiplied by the forward current ratio of transistor 30 and may, for example, also be of the order of 1 megohm. The signal developed at junction point 24 will thus be roughly equal to the product of $\Delta I_C$ multiplied by the parallel combination of the output impedance of transistor 26 and the reflected load. This signal is then coupled to output terminal 6 by means of the emitter follower 30.

The capacitance associated with junction point 24 includes the drain-to-gate capacitance ($C_{DG}$) and the drain-to-substrate capacitance ($C_{DS}$) of transistor 20 as well as the collector capacitance of transistor 26 and the capacitance, actual and reflected, of the output stage 44. The sum of these capacitances render junction point 24 the dominant capacitive point in the circuit. Note that though this point is the most capacitive of any node in the circuit, its magnitude is only of the order of 2 picofarads ($2\times10^{-12}f$) which is quite low.

Junction point 24 being the major capacitive node in the circuit and there being no other high capacitances to be charged or discharged, the amplifier can operate at extremely high speeds. Furthermore, the output emitter follower 30 which is required to drive the load $Z_L$ with which there may be coupled some capacitances has a current capacity of beta—forward current gain—times the signal current. Thus, where more capacitance may be present, the amplifier is designed to have a higher level current generating source which also aids in providing a fast, high slew rate amplifier.

In summary, it may be seen that a single current amplifying stage (the differential input stage) in combination with a single-voltage amplifying stage (the common gate stage 20) can provide a fast and high-gain amplifier. Amplifiers embodying the invention which have been built typically have an open loop gain of 3,000 and a slew rate at unity gain of 80 volts per microsecond. The combination of features discussed above thus makes this circuit highly suitable for high-speed, high slew rate operation.

Figure 2:
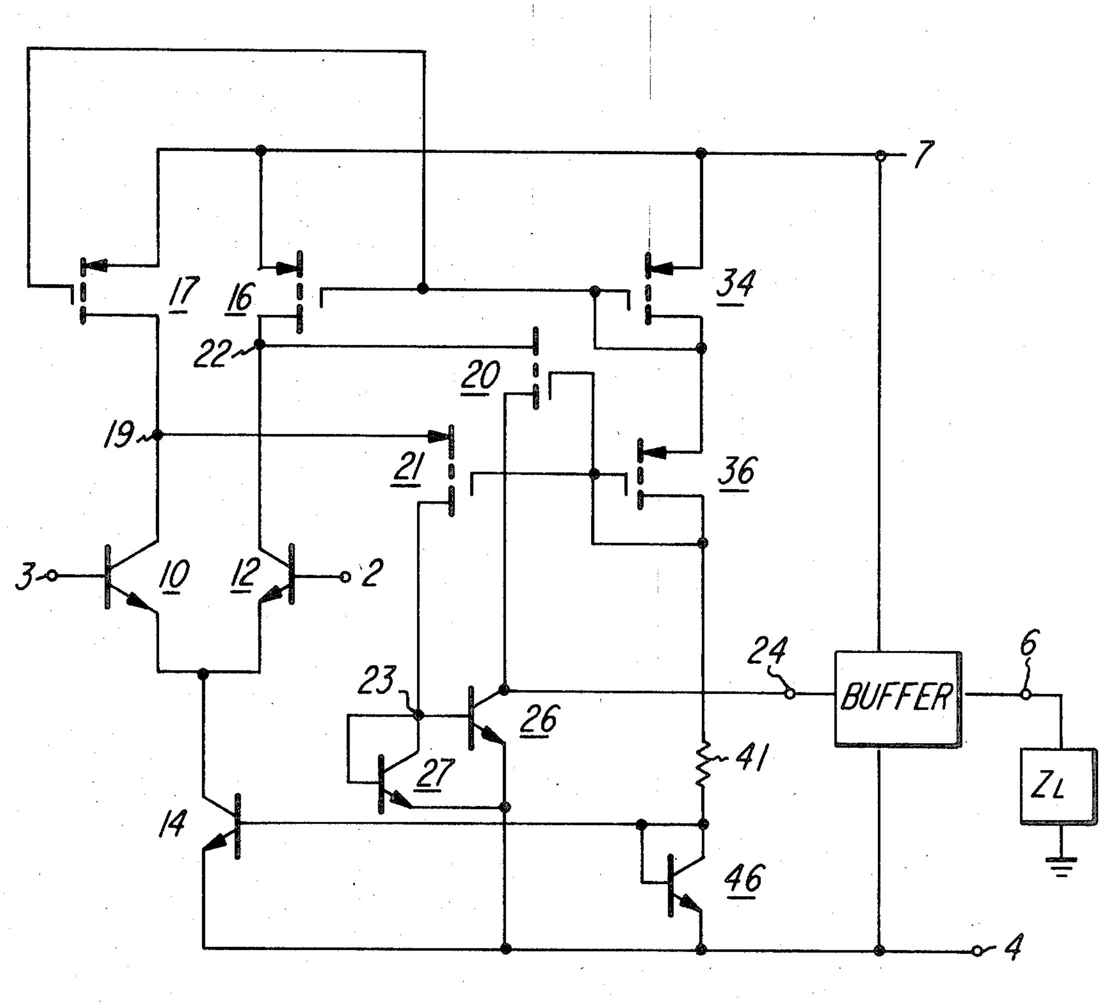
FIG. 2 is a schematic diagram of a double-ended differential amplifier embodying the invention.

The circuit of FIG. 2 is a double-ended differential amplifier embodying the invention. The amplifier is similar to the one shown in FIG. 1 with the addition of: (1) a second active load transistor 17 connected between the collector of transistor 10 and terminal 7; (2) a second level shift and signal translating stage comprising transistor 21 having its source-drain path connected between junction point 19 and the collector-base of transistor 27 at junction point 23; and (3) transistor 27 connected as a diode with its collector and base connected to the base of transistor 26 and its emitter connected to terminal 4. Transistor 27 acts as a current source which "sinks" the quiescent current flowing through transistor 21. Transistors 26 and 27 are connected to convert a differential signal into a single-ended output. As connected, their collector-to-emitter currents are equal. The use of the two outputs at junction points 19 and 22 together with the translating stage transistors 20 nd 21 and the current sink transistors 26 and 27 enable the double-ended amplifier to have twice the gain of the circuit shown in FIG. 1.

Assume for tutorial purposes that a differential signal is applied across terminals 2 and 3 and that the potential at terminal 2 is now more positive than that at terminal 3. The current into transistor 12 increases by a given amount which may be assumed to be $\Delta I_C$. This causes the current in the source-drain path of transistor 20 to decrease by $\Delta I_C$. Thus the current provided by transistor 20 into junction point 24 has decreased by $\Delta I_C$. Concurrently the current into transistor 10 decreases by $\Delta I_C$—the same amount by which the current to transistor 12 increased. This causes an increase of $\Delta I_C$ in the current flowing in the source-drain path of transistor 21 and into the collector-to-emitter path of transistor 27. The increased current ($\Delta I_C$) in transistor 27 causes an equal increase in the collector-to-emitter current of transistor 26. Note that transistor 26 now "sinks" an additional $\Delta I_C$. The net decrease in current flowing into the buffer through junction point 24 is thus two times $\Delta I_C$. The gain of the double-ended differential amplifier is thus twice the gain or the single-ended version. Typically the amplifier of FIG. 2 with an emitter follower output stage like that of FIG. 1 may have an open loop gain of the order of 6,000.

The buffer circuit, however, may be any circuit adapted to take the output signal generated at junction point 24 and capable of translating the signal to the output load $Z_L$.

What is claimed is:

1. In combination:

a differential amplifier stage comprising first and second bipolar transistors of the same conductivity type, each transistor having a base, an emitter, and a collector electrode; a pair of input signal terminals, one connected to each base electrode; a common connection to which both emitter electrodes are connected, and a relatively constant current source coupled to said common emitter connection for supplying a constant current to said transistors;

two field-effect transistors (FET's) each having a source and a drain electrode defining the ends of a conduction path and a gate electrode whose applied potential controls the conductivity of the conduction path;

a substantially constant second current source, including the source-drain path of the first one of said FET's connected to the collector electrode of one of said bipolar transistors and providing more current than that bipolar transistor passes;

output load means having an input node and an output terminal; and level shift and signal-translating means comprising the source-drain path of the second one of said FET's connected between the collector electrode of said one bipolar transistor and the input node of said output load means, said shift means including means for applying a relatively constant potential to the gate of said second FET in a direction to forward bias it and for operating it in the common gate mode, said second FET carrying that portion of the current supplied by said second current source not carried by said one transistor.

2. The combination as claimed in claim 1;

wherein said output load means includes a third bipolar transistor of said one conductivity type operated as an emitter follower with its base connected to one end of the source-drain path of the FET of said level shift and signal translating means and its emitter connected to said output terminal; and wherein the output load means further includes a fourth bipolar transistor of said one conductivity type connected at its collector to said output terminal for drawing a constant current out of said output terminal.

3. The combination as claimed in claim 1;

further including a relatively fixed source of bias potential; and means for applying said source of bias potential between the gate and source electrodes of the FET of said second current source, whereby said current source FET provides a relatively constant operating current to said one bipolar transistor and to the level shift FET.

4. The combination as claimed in claim 3:
wherein said level shift and signal-translating means includes a second relatively fixed source of bias potential; and
means for applying said second source of bias potential to the gate of said level shift FET for biasing said FET in the conducting state and maintaining the gate potential of said FET at a relatively fixed direct current potential.

5. The combination as claimed in claim 4:
wherein said first and second biasing sources are comprised, respectively; of a third and a fourth field-effect transistor (FET) each of said third and fourth FET's having its gate connected to its drain;
further including means for respectively connecting the gate and source electrodes of said third FET to the gate and source electrodes of said current source FET; and
further including means for respectively connecting the gate and drain electrodes of said fourth FET to the gate of said level shift FET.

6. The combination as claimed in claim 5:
further including a pair of power terminals adapted to receive an operating potential, and impedance means; and
means connecting between said pair of power terminals the source-drain paths of said third transistor in series with the source-drain path of said fourth transistor in series with said impedance means for generating a bias current through said third and fourth FET's and said impedance means.

7. The combination as claimed in claim 6 further including a substantially constant current means connected at the input node of said output load means for receiving the quiescent direct current supplied by said second current source not carried by said one transistor.

8. The combination as claimed in claim 5:
wherein each of said FET's is an insulated-gate transistor of the P-channel enhancement type; and
wherein each of said bipolar transistors is a transistor of the vertical type.

9. In an amplifier having a differential input stage comprised of bipolar transistors on one conductivity type, said input stage having at least one output point and an output stage comprised of bipolar transistors of the same conductivity type having an input node and an output terminal for producing an output signal in response to a signal applied at said input node, the improvement comprising:
first and second field-effect transistors (FET's) each having a source and a drain electrode defining the ends of a conduction path and a gate electrode whose applied potential controls the conductivity of the conduction path;
means direct current coupling the source-drain path of said first FET between the output point of said input stage and a power terminal adapted to receive a source of operating potential;
means direct current coupling the source-drain path of said second FET between the output point of said input stage and the input node of said output stage;
a first relatively constant source of potential coupled between the gate and source electrodes of said first FET applied in a direction to render said first FET conducting a substantially constant current; and
a second relatively constant source of potential coupled to the gate electrode of said second FET applied in a direction to render said FET conducting.

10. The combination as claimed in claim 9:
wherein said first relatively constant source of potential includes a third field-effect transistor having its source-drain path connected between the gate and the source electrode of said first FET;
wherein said second relatively constant source of potential includes a fourth field-effect transistor having its gate and drain electrodes connected to the gate electrode of said second FET; and
wherein the gate electrodes of said third and fourth FETs are connected to their respective drain electrodes.

11. In combination:
first and second vertical bipolar transistors of the same conductivity type, each transistor having a base, an emitter and a collector electrode, a pair of input terminals, one connected to each base electrode; a common connection to which both emitter electrodes are connected, and a relatively constant current source coupled to said common emitter connection for supplying a constant current to said transistors;
a plurality of field-effect transistors (FET's) each having a source and a drain electrode defining the ends of a conduction path and a gate electrode whose applied potential controls the conductivity of the conduction path;
second and third substantially constant current sources, each source including the source-drain path of one of said FETs, respectively connected to the collector electrode of one of said first and second bipolar transistors and each current source providing more current than its associated bipolar transistor passes;
first and second junction points;
first and second level shift and signal-translating means, connected between a different one of the collector electrodes of said bipolar transistors and said junction points, said first means including the source to drain path of a FET connected between the collector of said first bipolar transistor and said first junction point and said second means including the source-drain path of a different FET connected between the collector of said second bipolar transistor and said second junction point said FETs of the level shift and signal-translating means carrying that portion of the current supplied by the current sources not carried by their associated bipolar transistors;
first and second means connected respectively at said first and second junction points for: (a) conducting that portion of the direct operating current supplied by said second and third current source not carried by said first and second bipolar transistors, and (b) combining the signal currents flowing in said first and second signal-translating means for generating at one of said two junction points a signal current having twice the amplitude of the individual signal currents; and
output load means coupled to that one of said two junction points for producing an output in response to the generation of said signal current.

12. In an amplifier having a differential input stage comprised of bipolar transistors, said input stage having first and second differential output points for producing differential signals in response to input signals applied to said differential stage, the improvement comprising:
first and second FET's each having a source and a drain electrode defining the ends of a conduction path and a gate electrode whose applied potential controls the conductivity of the conduction path;
first and second junction points;
means connecting the source-drain path of said first FET between said first differential output point and said first junction point;
means connecting the source-drain path of said second FET between said second differential output point and said second junction point;
first and second biasing means, respectively, coupled to the gate electrodes of said first and second FETs for providing a relatively constant direct current potential to the gate electrodes of said FET's for rendering them conducting;
means single-ending the differentially producing signals comprising first and second bipolar transistors each having a base, an emitter and collector electrodes; means connecting the collector and base electrode of said first transistor in common with the base electrode of said second transistor to said first junction point; and means connecting the collector electrode of said second transistor to said second junction point; means for connecting the emitter electrodes of said first and second transistors in common to a point of relatively fixed potential in a direction to forward bias said bipolar transistors.

* * * * *

UNITED STATES PATENT OFFICE
CERTIFICATE OF CORRECTION

Patent No. 3,644,838 Dated February 22, 1972

Inventor(s) Stefano Graf

It is certified that error appears in the above-identified patent and that said Letters Patent are hereby corrected as shown below:

Col. 1, line 15: Change "(v/µsec.)" to -- (V/µsec) --

Col. 1, line 49: Before "short" insert -- ( --

Col. 1, line 56: Change "It" to -- If --

Col. 2, line 50: Change "($Y_b$)" to -- ($\tau_b$) --

Col. 2, line 51: Change "($Y_c$)" to -- ($\tau_c$) --

Col. 2, line 54: Change "$Y_b$" to -- $\tau_b$ --

Col. 2, line 61: Change "$Y_c$" to -- $\tau_c$ --

Col. 2, line 70: Change "$Y_c$" to -- $\tau_c$ --

Col. 2, line 70: Change "$Y_b$" to -- $\tau_b$ --

Col. 1, line 65: Delete "," (second occurrence)

Col. 3, line 4: Change "$Y_c$" to -- $\tau_c$ --

Col. 3, line 4: Change "$Y_b$" to -- $\tau_b$ --

Col. 3, line 5: Change "$Y_c/Y_b$" to -- $\tau_c/\tau_b$ --

Col. 3, line 11: Change "$Y_c/Y_b$" to -- $\tau_c/\tau_b$ --

Col. 3, line 62: Before "i.e." insert -- ( --

Col. 3, line 74: Change "($10_7$ HZ)" to ($10^7$HZ) --

UNITED STATES PATENT OFFICE
CERTIFICATE OF CORRECTION

Patent No. 3,644,838 Dated February 22, 1972

- 2 -

Inventor(s) Stefano Graf

It is certified that error appears in the above-identified patent and that said Letters Patent are hereby corrected as shown below:

Col. 5, line 50: "$_B$" should read -- $I_B$ --

Col. 5, line 54: Change "fro" to -- for --

Col. 5, line 65: "$(I_b x R_{42})$" should read -- $(I_B x R_{42})$

Col. 5, line 70: "$I_B R_{42+vBE}$" should read -- $I_B R_{42} + V_{BE}$ --

Col. 6, line 61: Change "larege" to -- large --

Col. 7, line 73: "nd" should read -- and --

Col. 9, line 12: change ";" to -- , --

Signed and sealed this 13th day of March 1973.

(SEAL)
Attest:

EDWARD M.FLETCHER,JR.
Attesting Officer

ROBERT GOTTSCHALK
Commissioner of Patents